United States Patent
Bishop

(10) Patent No.: US 9,818,659 B2
(45) Date of Patent: Nov. 14, 2017

(54) MULTI-DIE PACKAGE COMPRISING UNIT SPECIFIC ALIGNMENT AND UNIT SPECIFIC ROUTING

(71) Applicant: DECA Technologies Inc., Tempe, AZ (US)

(72) Inventor: Craig Bishop, Tempe, AZ (US)

(73) Assignee: DECA Technologies Inc., Tempe, AZ (US)

(*) Notice: Subject to any disclaimer, the term of this patent is extended or adjusted under 35 U.S.C. 154(b) by 0 days.

(21) Appl. No.: 15/290,897

(22) Filed: Oct. 11, 2016

(65) Prior Publication Data

US 2017/0103927 A1 Apr. 13, 2017

Related U.S. Application Data

(60) Provisional application No. 62/240,399, filed on Oct. 12, 2015.

(51) Int. Cl.
| | |
|---|---|
| *H01L 23/00* | (2006.01) |
| *H01L 21/66* | (2006.01) |
| *H01L 23/538* | (2006.01) |
| *H01L 21/56* | (2006.01) |

(52) U.S. Cl.
CPC .......... *H01L 22/26* (2013.01); *H01L 23/5386* (2013.01); *H01L 24/19* (2013.01); *H01L 24/20* (2013.01); *H01L 24/96* (2013.01); *H01L 24/97* (2013.01); *H01L 21/568* (2013.01); *H01L 2224/04105* (2013.01); *H01L 2224/12105* (2013.01); *H01L 2224/24137* (2013.01); *H01L 2224/94* (2013.01); *H01L 2924/19041* (2013.01); *H01L 2924/19042* (2013.01); *H01L 2924/19043* (2013.01); *H01L 2924/19105* (2013.01)

(58) Field of Classification Search
CPC ..... H01L 22/26; H01L 23/5386; H01L 24/82; H01L 25/0655; H01L 25/50
See application file for complete search history.

(56) References Cited

U.S. PATENT DOCUMENTS

| 9,040,316 | B1 | 5/2015 | Scanlan et al. |
| 2011/0278741 | A1 | 11/2011 | Chua et al. |
| 2013/0249088 | A1 | 9/2013 | Scanlan et al. |
| 2013/0280826 | A1* | 10/2013 | Scanlan ................ H01L 23/544 438/15 |

(Continued)

*Primary Examiner* — Whitney T Moore
*Assistant Examiner* — Joseph Galvin, III
(74) *Attorney, Agent, or Firm* — Booth Udall Fuller, PLC

(57) ABSTRACT

A method of making a semiconductor device can include forming an embedded die panel by encapsulating a first semiconductor die and a second semiconductor die with conductive interconnects in a single step. An actual position of the first semiconductor die and second semiconductor die can be measured within the embedded die panel. The first semiconductor die and the second semiconductor die can be interconnected by a build-up interconnect structure comprising a first unit specific alignment portion aligned with the first semiconductor die, a second unit specific alignment portion aligned with the second semiconductor die, unit specific routing connecting the first unit specific alignment portion and the second unit specific alignment portion, and a fixed portion aligned with outline of embedded die panel and coupled to the unit specific routing.

20 Claims, 9 Drawing Sheets

(56) References Cited

U.S. PATENT DOCUMENTS

2014/0159228 A1* 6/2014 Teh .................... H01L 23/3114
257/734
2015/0187710 A1 7/2015 Scanlan et al.

* cited by examiner

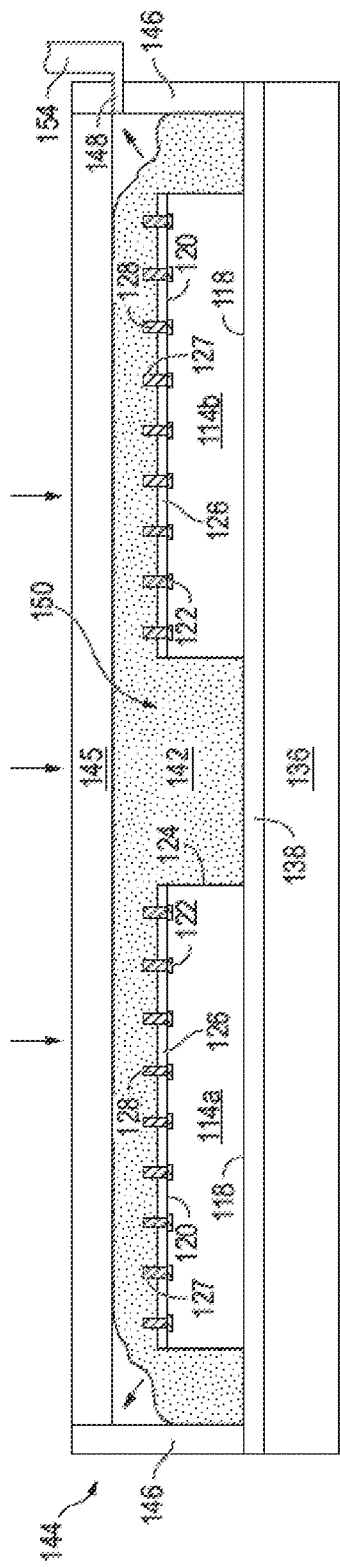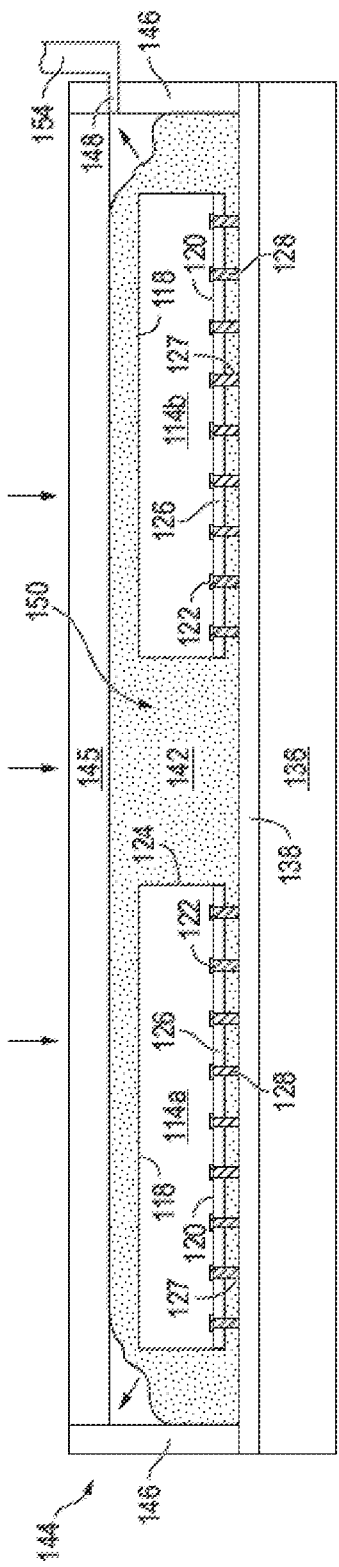

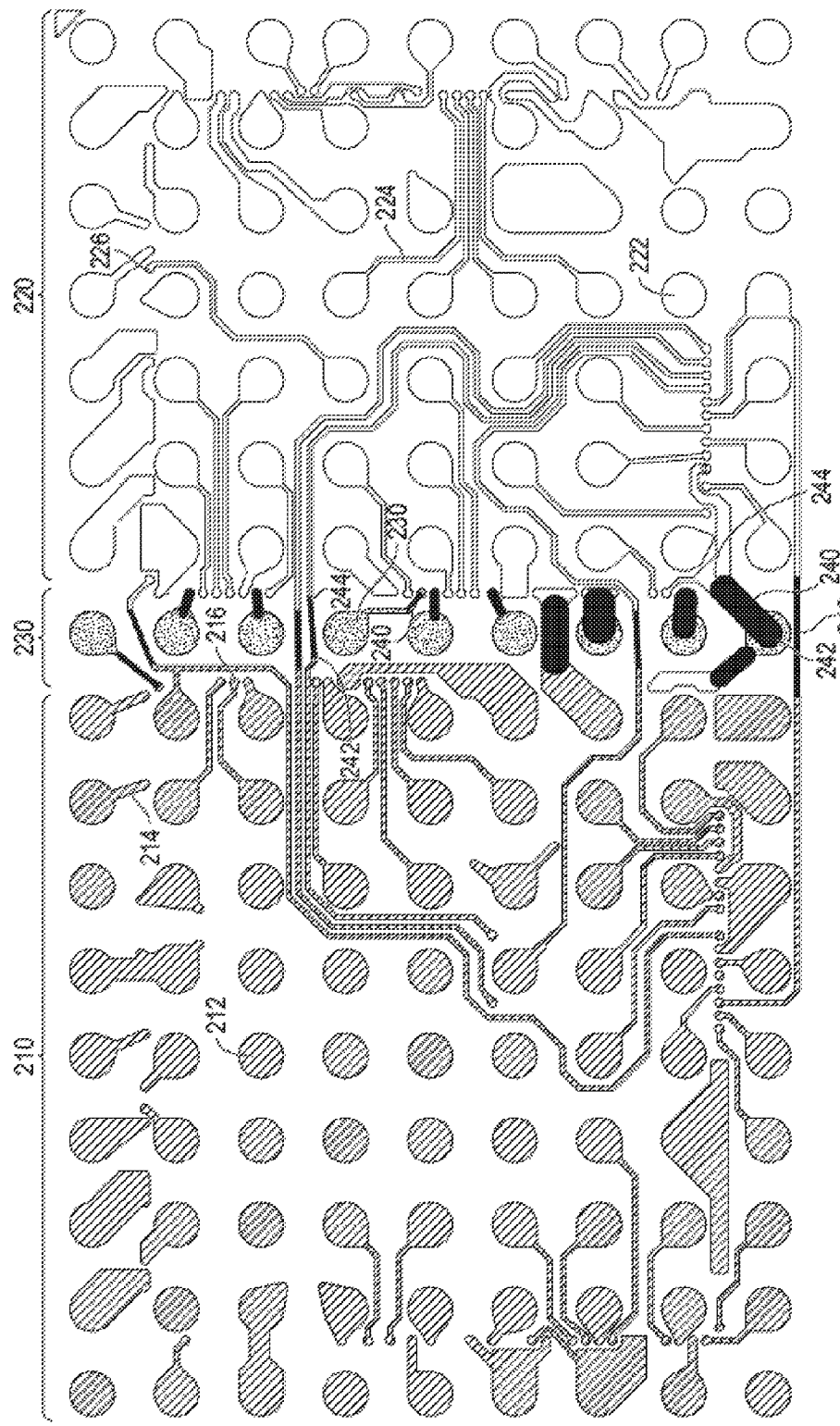

MULTI-DIE PACKAGE COMPRISING UNIT SPECIFIC ALIGNMENT AND UNIT SPECIFIC ROUTING

CROSS-REFERENCE TO RELATED APPLICATIONS

This application claims the benefit, including the filing date, of U.S. Provisional Patent No. 62/240,399, entitled "Multi-Die Package Comprising Adaptive Alignment and Adaptive Routing," which was filed on Oct. 12, 2015, the disclosure of which is hereby incorporated herein by this reference.

TECHNICAL FIELD

The disclosure relates to semiconductor packaging and methods of making the same.

BACKGROUND

Semiconductor devices are commonly found in modern electronic products. Semiconductor devices vary in the number and density of electrical components. Discrete semiconductor devices generally contain one type of electrical component, for example, light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, that is, front-end manufacturing, and back-end manufacturing, each involving potentially hundreds of steps. Front-end manufacturing involves the formation of a plurality of semiconductor die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

Conventional methods of packaging semiconductor die include the deposition, patterning, and formation of conductive layers and insulating layers for providing desired electrical interconnections with the semiconductor die. Conventionally, patterned conductive layers, including redistributions layers (RDLs) and capture pads, such as capture pads disposed above openings in via layers have been made large enough to account for semiconductor die shift that occurs during processing in order to retain high process yield of packaged semiconductor die. Many process rely on low-speed, high-accuracy semiconductor die attach tools to reduce or minimize semiconductor die shift, while also increasing or maximizing interconnect density by reducing a size required for the via capture pads.

SUMMARY

An opportunity exists for improved semiconductor manufacturing. Accordingly, in an aspect, a method of making a semiconductor device can comprise forming an embedded die panel by encapsulating at least four side surfaces and an active surface of a first semiconductor die, a second semiconductor die, and side surfaces of conductive interconnects coupled to the first semiconductor die and the second semiconductor die with encapsulant in a single step. An actual position of the first semiconductor die and an actual position of the second semiconductor die can be measured within the embedded die panel to obtain a rotation measurement of the first semiconductor die, a XY shift of the first semiconductor die, a rotation measurement of the second semiconductor die, and a XY shift of the second semiconductor die. The conductive interconnects of the first semiconductor die and the second semiconductor die can be measured by forming a build-up interconnect structure over the embedded die panel, the build-up interconnect structure being formed by forming a first unit specific alignment portion aligned with the first semiconductor die, forming a second unit specific alignment portion aligned with the second semiconductor die, forming unit specific routing connecting the first unit specific alignment portion and the second unit specific alignment portion, and forming a fixed portion aligned with outline of embedded die panel and coupled to the unit specific routing.

The method of making the semiconductor device can further comprise adjusting a design of the build-up interconnect structure before forming the build-up interconnect structure over the embedded die panel by splitting the build-up interconnect structure into multiple portions, including the first unit specific alignment portion and the second unit specific alignment portion. A plurality of unit specific routing endpoints can be defined for each of the first unit specific alignment and the second unit specific alignment. Each of the plurality of unit specific routing endpoints can be assigned to a segment of the first unit specific alignment portion, a segment of the second unit specific alignment portion, or a mark fixed relative to a package edge. The embedded die panel comprising a third semiconductor die with a third unit specific alignment portion aligned with the third semiconductor die and the unit specific routing connecting the third unit specific alignment portion to the first unit specific alignment portion and the second unit specific alignment portion. The design of the build-up interconnect structure can be made before forming the build-up interconnect structure over the embedded die panel by rotating the first unit specific alignment portion by the rotation measurement of the first semiconductor die, shifting the first unit specific alignment portion by the XY shift of the first semiconductor die, rotating the second unit specific alignment portion by the rotation measurement of the second semiconductor die, shifting the second unit specific alignment portion by the XY shift of the second semiconductor die, and forming the unit specific routing connecting the first unit specific alignment portion and the second unit specific alignment portion by auto-routing between the unit specific routing endpoints for each of the first unit specific alignment and the second unit specific alignment while preserving minimum spacing between the unit specific routing connections. A rotation or XY shift of the build-up interconnect structure can be no greater than the rotation measurement of the first semiconductor die, the XY shift of the first semiconductor die, the rotation measurement of the second semiconductor die, and the XY shift of the second semiconductor die. A temporary carrier can comprise an adhesive disposed over a top surface of the temporary carrier, a first semiconductor die comprising conductive interconnects can be coupled to an active surface of the first semiconductor die, a second semiconductor die can comprise conductive interconnects coupled to an active surface of the second semiconductor die, and the first semiconductor die and the second semiconductor die can be mounted face up to the temporary carrier.

In another aspect, a method of making a semiconductor device can comprise forming an embedded die panel and measuring an actual position of a first semiconductor die and an actual position of a second semiconductor die within the embedded die panel to obtain a rotation measurement and XY shift for the first semiconductor die and the second semiconductor die. The first semiconductor die and the second semiconductor die can be interconnected by forming a build-up interconnect structure over the embedded die panel, the build-up interconnect structure being formed by: forming a first prestratum aligned with the first semiconductor die, forming a second prestratum aligned with the second semiconductor die, and forming unit specific routing connecting the first prestratum and the second prestratum.

The method of making the semiconductor device can further comprise a fixed portion can be formed aligned with outline of embedded die panel and coupled to the unit specific routing. The build-up interconnect structure can be split into multiple portions, including the first prestratum and the second prestratum. A plurality of unit specific routing endpoints can be defined for each of the first prestratum and the second prestratum and each of the plurality of unit specific routing endpoints can be assigned to the first prestratum, the second prestratum, or a prestratum fixed relative to a package edge. The design of the build-up interconnect structure can be adjusted before forming the build-up interconnect structure over the embedded die panel by: rotating the first prestratum by the rotation measurement of the first semiconductor die, shifting the first prestratum by the XY shift of the first semiconductor die, and rotating the second prestratum by the rotation measurement of the second semiconductor die, and shifting the second prestratum by the XY shift of the second semiconductor die. A rotation or XY shift of the build-up interconnect structure can be no greater than the rotation measurement of the first semiconductor die, the XY shift of the first semiconductor die, the rotation measurement of the second semiconductor die, and the XY shift of the second semiconductor die. A spacing between the unit specific routing can be controlled to provide spacing greater than or equal to a distance of 10 micrometers between the first prestratum and the second prestratum. The first prestratum, the second prestratum, and the unit specific routing can be formed connecting the first prestratum and the second prestratum within a single planar conductive layer.

In another aspect, a method of making a semiconductor device can comprise forming an embedded die panel, and measuring an actual position of a first semiconductor die and an actual position of a second semiconductor die within the embedded die panel to obtain a rotation measurement and XY shift for the first semiconductor die and the second semiconductor die. The first semiconductor die and the second semiconductor die can be interconnected by forming a build-up interconnect structure over the embedded die panel by forming a first prestratum, forming a second prestratum, and forming unit specific routing connecting the first prestratum and the second prestratum.

The method of making the semiconductor device can further comprise the first prestratum can be aligned with the first semiconductor die, and the second prestratum can be aligned with the second semiconductor die. A fixed portion can be aligned with outline of embedded die panel and coupled to the unit specific routing. A spacing tolerance between the unit specific routing can be controlled to provide spacing greater than or equal to a distance of 10 micrometers between the first prestratum and the second prestratum. The first prestratum can be shifted by the rotation measurement of the first semiconductor die, the first prestratum can be shifted by the XY shift of the first semiconductor die, the second prestratum can be rotated by the rotation measurement of the second semiconductor die, and the second prestratum can be shifted by the XY shift of the second semiconductor die. The rotation measurement and the XY shift for one of the first semiconductor die or the second semiconductor die in the embedded die panel can comprise a maximum rotation measurement or XY shift that is equal to a maximum semiconductor device rotation measurement or XY shift. The first prestratum, the second prestratum, and the unit specific routing can connect the first prestratum and the second prestratum while being formed as a single planar conductive layer.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

FIGS. 2A-2L illustrate an aspect of formation of a semiconductor device or package.

DETAILED DESCRIPTION

Figure 1A:
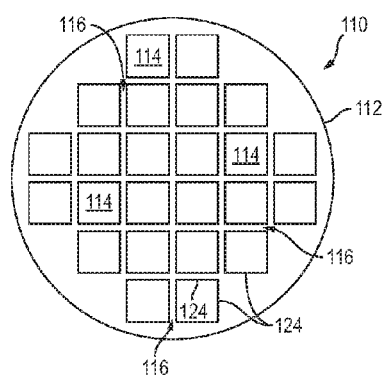
FIGS. 1A-1D illustrate an aspect processing of semiconductor die from a native wafer.

The present disclosure includes one or more aspects or embodiments in the following description with reference to the figures, in which like numerals represent the same or similar elements. Those skilled in the art will appreciate that the description is intended to cover alternatives, modifications, and equivalents as may be included within the spirit and scope of the disclosure as defined by the appended claims and their equivalents as supported by the following disclosure and drawings. In the description, numerous specific details are set forth, such as specific configurations, compositions, and processes, etc., in order to provide a thorough understanding of the disclosure. In other instances, well-known processes and manufacturing techniques have not been described in particular detail in order to not unnecessarily obscure the disclosure. Furthermore, the various embodiments shown in the FIGs. are illustrative representations and are not necessarily drawn to scale.

This disclosure, its aspects and implementations, are not limited to the specific equipment, material types, or other system component examples, or methods disclosed herein. Many additional components, manufacturing and assembly procedures known in the art consistent with manufacture and packaging are contemplated for use with particular implementations from this disclosure. Accordingly, for example, although particular implementations are disclosed, such implementations and implementing components may comprise any components, models, types, materials, versions, quantities, and/or the like as is known in the art for such systems and implementing components, consistent with the intended operation.

The word "exemplary," "example," or various forms thereof are used herein to mean serving as an example, instance, or illustration. Any aspect or design described herein as "exemplary" or as an "example" is not necessarily to be construed as preferred or advantageous over other aspects or designs. Furthermore, examples are provided solely for purposes of clarity and understanding and are not meant to limit or restrict the disclosed subject matter or relevant portions of this disclosure in any manner. It is to be appreciated that a myriad of additional or alternate examples of varying scope could have been presented, but have been omitted for purposes of brevity.

Where the following examples, embodiments and implementations reference examples, it should be understood by those of ordinary skill in the art that other manufacturing devices and examples could be intermixed or substituted with those provided. In places where the description above refers to particular embodiments, it should be readily apparent that a number of modifications may be made without departing from the spirit thereof and that these embodiments and implementations may be applied to other technologies as well. Accordingly, the disclosed subject matter is intended to embrace all such alterations, modifications and variations that fall within the spirit and scope of the disclosure and the knowledge of one of ordinary skill in the art.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Patterning is the basic operation by which portions of the top layers on the semiconductor wafer surface are removed. Portions of the semiconductor wafer can be removed using photolithography, photomasking, masking, oxide or metal removal, photography and stenciling, and microlithography. Photolithography includes forming a pattern in reticles or a photomask and transferring the pattern into the surface layers of the semiconductor wafer. Photolithography forms the horizontal dimensions of active and passive components on the surface of the semiconductor wafer in a two-step process. First, the pattern on the reticle or masks is transferred into a layer of photoresist. Photoresist is a light-sensitive material that undergoes changes in structure and properties when exposed to light. The process of changing the structure and properties of the photoresist occurs as either negative-acting photoresist or positive-acting photoresist. Second, the photoresist layer is transferred into the wafer surface. The transfer occurs when etching removes the portion of the top layers of semiconductor wafer not covered by the photoresist. The chemistry of photoresists is such that the photoresist remains substantially intact and resists removal by chemical etching solutions while the portion of the top layers of the semiconductor wafer not covered by the photoresist is removed. The process of forming, exposing, and removing the photoresist, as well as the process of removing a portion of the semiconductor wafer can be modified according to the particular resist used and the desired results.

In negative-acting photoresists, photoresist is exposed to light and is changed from a soluble condition to an insoluble condition in a process known as polymerization. In polymerization, unpolymerized material is exposed to a light or energy source and polymers form a cross-linked material that is etch-resistant. In most negative resists, the polymers are polyisoprenes. Removing the soluble portions (i.e. the portions not exposed to light) with chemical solvents or developers leaves a hole in the resist layer that corresponds to the opaque pattern on the reticle. A mask whose pattern exists in the opaque regions is called a clear-field mask.

In positive-acting photoresists, photoresist is exposed to light and is changed from relatively nonsoluble condition to much more soluble condition in a process known as photo-solubilization. In photosolubilization, the relatively insoluble resist is exposed to the proper light energy and is converted to a more soluble state. The photosolubilized part of the resist can be removed by a solvent in the development process. The basic positive photoresist polymer is the phenol-formaldehyde polymer, also called the phenol-formaldehyde novolak resin. Removing the soluble portions (i.e. the portions exposed to light) with chemical solvents or developers leaves a hole in the resist layer that corresponds to the transparent pattern on the reticle. A mask whose pattern exists in the transparent regions is called a dark-field mask.

After removal of the top portion of the semiconductor wafer not covered by the photoresist, the remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface can be beneficial or required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. Alternatively, mechanical abrasion without the use of corrosive chemicals is used for planarization. In some embodiments, purely mechanical abrasion is achieved by using a belt grinding machine, a standard wafer backgrinder, or other similar machine. The combined mechanical action of the abrasive and corrosive action of the chemical removes any irregular topography, resulting in a uniformly flat surface.

Back-end manufacturing refers to cutting or singulating the finished wafer into the individual semiconductor die and then packaging the semiconductor die for structural support and environmental isolation. To singulate the semiconductor die, the wafer can be cut along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, redistribution layers, or wirebonds. An encapsulant or other molding material is deposited over the package to provide physical support and electrical isolation. The finished package is then inserted into an electrical system and the functionality of the semiconductor device is made available to the other system components.

The electrical system can be a stand-alone system that uses the semiconductor device to perform one or more electrical functions. Alternatively, the electrical system can be a subcomponent of a larger system. For example, the electrical system can be part of a cellular phone, personal digital assistant (PDA), digital video camera (DVC), or other electronic communication device. Alternatively, the electrical system can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction can be beneficial or essential for the products to be accepted by the market. The distance between semiconductor devices must be decreased to achieve higher density.

By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

FIGS. 1A-1D show a plurality of semiconductor die or semiconductor devices 114 that have been formed according to front-end manufacturing methods and procedures as outlined above. More specifically, FIG. 1A shows a top or plan view of a semiconductor wafer, device wafer, or native wafer 110 with a base substrate material 112, such as, without limitation, silicon, germanium, gallium arsenide, indium phosphide, or silicon carbide, for structural support. A plurality of semiconductor die or components 114 is formed on wafer 110 separated by a non-active, inter-die wafer area or saw street 116 as described above. Saw streets 116 provide cutting areas to singulate semiconductor wafer 110 into individual semiconductor die 114.

Figure 1B:
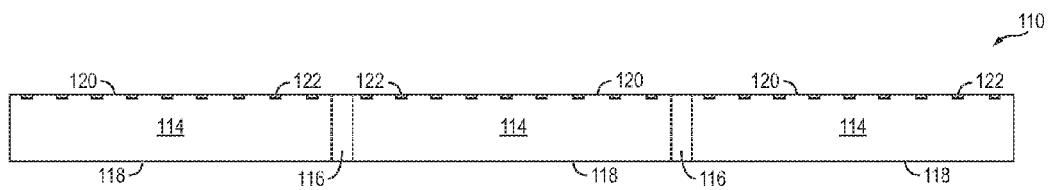

FIG. 1B shows a cross-sectional profile view of a portion of semiconductor wafer 110, perpendicular to the view shown in FIG. 1A. Each semiconductor die 114 has a backside or back surface 118 and an active surface 120 opposite the backside. The active surface 120 contains analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 120 to implement analog circuits or digital circuits, such as DSP, ASIC, memory, or other signal processing circuit. The semiconductor die 114 may also contain integrated passive device (IPDs) such as inductors, capacitors, and resistors, for RF signal processing.

An electrically conductive layer or contact pad 122 is formed over active surface 120 using PVD, CVD, electrolytic plating, electroless plating process, or other suitable metal deposition process. Conductive layer 122 can be one or more layers of aluminum (Al), copper (Cu), tin (Sn), nickel (Ni), gold (Au), silver (Ag), or other suitable electrically conductive material. Conductive layer 122 operates as contact pads or bond pads electrically coupled or connected to the circuits on active surface 120. Conductive layer 122 can be formed as contact pads disposed side-by-side a first distance from the edge of semiconductor die 114, as shown in FIG. 1B. Alternatively, conductive layer 122 can be formed as contact pads that are offset in multiple rows such that a first row of contact pads is disposed a first distance from the edge of the die, and a second row of contact pads alternating with the first row is disposed a second distance from the edge of the die.

Figure 1C:
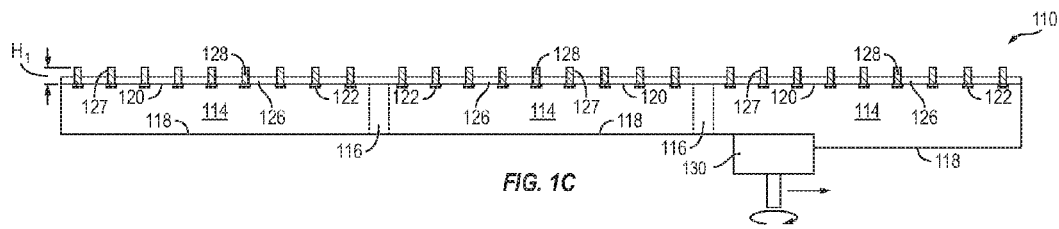

FIG. 1C shows an optional insulating or passivation layer 126 conformally applied over active surface 120 and over conductive layer 122. Insulating layer 126 can include one or more layers that are applied using PVD, CVD, screen printing, spin coating, spray coating, sintering, thermal oxidation, or other suitable process. Insulating layer 126 can contain, without limitation, one or more layers of silicon dioxide (SiO2), silicon nitride (Si3N4), silicon oxynitride (SiON), tantalum pentoxide (Ta2O5), aluminum oxide (Al2O3), polymer, polyimide, benzocyclobutene (BCB), polybenzoxazoles (PBO), or other material having similar insulating and structural properties. Alternatively, semiconductor die 114 are packaged without the use of any PBO layers, and insulating layer 126 can be formed of a different material or omitted entirely. In another embodiment, insulating layer 126 includes a passivation layer formed over active surface 120 without being disposed over conductive layer 122. When insulating layer 126 is present and formed over conductive layer 122, openings are formed completely through insulating layer 126 to expose at least a portion of conductive layer 122 for subsequent mechanical and electrical interconnection. Alternatively, when insulating layer 126 is omitted, conductive layer 122 is exposed for subsequent electrical interconnection without the formation of openings.

FIG. 1C also shows electrical interconnect structures 128 can be formed as studs, columns, pillars, or posts that are disposed over, and coupled or connected to, conductive layer 122. Interconnect structures 128 can be formed directly on conductive layer 122 using patterning and metal deposition processes such as printing, PVD, CVD, sputtering, electrolytic plating, electroless plating, metal evaporation, metal sputtering, or other suitable metal deposition process. Interconnect structures 128 can be one or more layers of Al, Cu, Sn, Ni, Au, Ag, palladium (Pd), or other suitable electrically conductive material and can include one or more UBM layers. In an embodiment, a photoresist layer is deposited over semiconductor die 114 and conductive layer 122. A portion of photoresist layer is exposed and removed by an etching development process. Electrical interconnect structures 128 are formed as pillars or copper pillars in the removed portion of the photoresist and over conductive layer 122 using a selective plating process. The photoresist layer is removed leaving interconnect structures 128 that provide for subsequent mechanical and electrical interconnection and a standoff with respect to active surface 120 and insulating layer 126, if present. In some instances interconnect structures 128 include a height H1 in a range of 10-100 micrometers (μm), and can be solder free. In other instances interconnect structures 128 include a height in a range of 20-50 μm. In yet other instances interconnect structures 128 include a height of about 35 μm.

FIG. 1C further shows wafer 110 may undergo an optional grinding operation with grinder 130 to planarize back surface 118 and reduce a thickness of the wafer. A chemical etch can also be used to remove and planarize a portion of wafer 110.

Figure 1D:
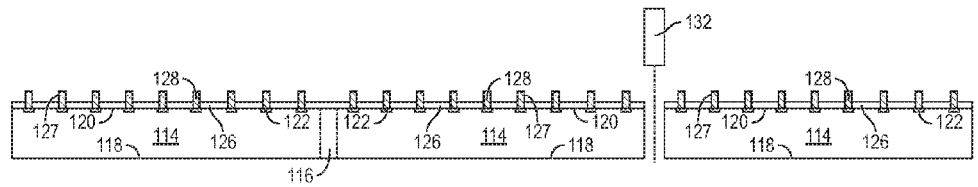

FIG. 1D shows after the formation of interconnect structures 128 and the optional grinding of wafer 110, wafer 110 is singulated through saw streets 116 using a saw blade or laser cutting tool 132 into individual semiconductor die 114.

Figure 2A:
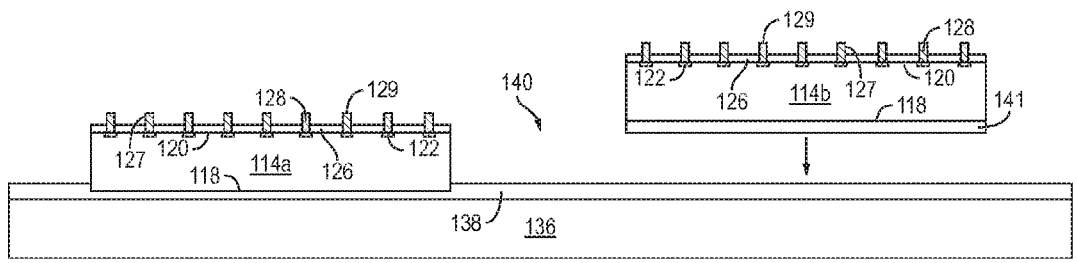
Figure 2B:
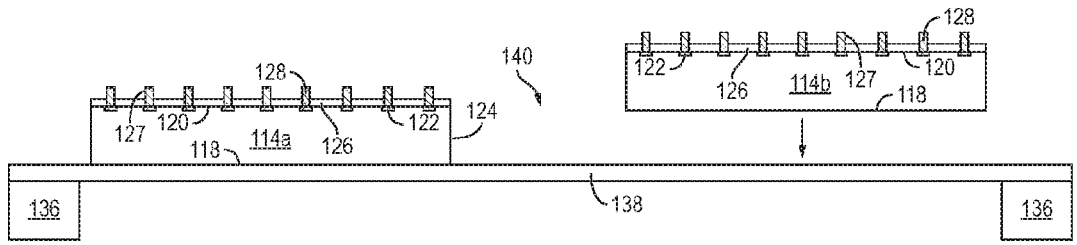

FIG. 2A shows a temporary carrier or substrate 136 containing temporary or sacrificial base material such as silicon, polymer, stainless steel, or other suitable low-cost, rigid material for structural support. An optional adhesive, interface layer, or double-sided tape 138 is formed over carrier 136 as a temporary adhesive bonding film or etch-stop layer. In an embodiment, such as shown in FIG. 2B, carrier 136 is a ring-shaped film frame comprising an open center portion that supports tape 138 at a periphery of the tape.

FIG. 2A further shows semiconductor die 114 from FIG. 1D mounted face up to carrier 136 and interface layer 138 with backside 118 oriented towards the substrate and active surface 120 oriented away from the carrier. Semiconductor die 114 can comprise a first semiconductor die or component 114a, that can be dedicated or directed to a particular purpose, such as logic or memory, as well as including one or more IPDs or other discrete devices or components. Semiconductor die 114 can comprise a second semiconductor die 114b that can be a dedicated or directed to a particular purpose different from the first semiconductor die 114a, such as memory or logic, respectively, as well as one or more IPDs or other discrete devices or components. While two semiconductor die or components 114, i.e. 114a and 114b, are shown for convenience of illustration, additional semiconductor die or components 114, such as three or any other suitable number can also be molded, electrically connected, and included within to semiconductor die 114a. While just two semiconductor die or components 114a and 114b are shown, more than two semiconductor die or components 114 can be included.

Semiconductor die 114 can be placed over carrier 136 using a pick and place operation or other suitable operation. An adhesive 141 is optionally disposed between backside 118 of semiconductor die 114 and carrier 136. Adhesive 141 can be thermal epoxy, epoxy resin, B-stage epoxy film, ultraviolet (UV) B-stage film with optional acrylic polymer, or other suitable material. In an embodiment, adhesive 141 can be disposed over backside 118 before semiconductor die 114 are mounted over carrier 136. Alternatively, adhesive 141 can be disposed on carrier 136 before mounting the semiconductor die to the carrier. In other embodiments, adhesive 141 is omitted and the semiconductor die 114 are mounted directly to adhesive 138 without use of adhesive 141 so that the backside 118 directly contacts the interface layer 138. When the adhesive 141 is omitted, back surfaces 118 of the semiconductor die 144, including a first semiconductor die 114a and a second semiconductor die 114b can be depressed within the carrier tape 138 before encapsulating the first semiconductor die 114a and the second semiconductor die 114b.

Semiconductor die 114 are mounted to carrier 136 such that the semiconductor die are separated by a space or gap 140 when mounted over carrier 136 that provides an area for a subsequently formed build-up interconnect structure, and can additionally include space for passive components disposed within the gap 140. A size of the gap 140 includes sufficient area for optionally mounting semiconductor devices or components within the subsequently formed embedded die panel or molded core unit.

FIG. 2C shows an encapsulant 142 is deposited using a paste printing, compression molding, transfer molding, liquid encapsulant molding, lamination, vacuum lamination, spin coating, or other suitable applicator. Specifically, FIG. 2C shows a mold 144 with a plurality of sidewalls 146 brought together with top portion or plate 145, carrier 136, and interface layer 138 to enclose semiconductor die 114 within the mold 144 for subsequent encapsulation. Mold 144 can also include a bottom portion on which carrier 136 is placed and to which sidewalls 146 can be in contact. In an embodiment, carrier 136 and adhesive 138 serve as the bottom mold portion for the subsequent encapsulation process. Alternatively, semiconductor die 114, carrier 136, and interface layer 138 may be disposed within a mold including multiple portions, such as top and bottom portions. Mold 144 is brought together by moving mold 144 around semiconductor die 114, or alternatively, by moving the semiconductor die into the mold.

FIG. 2C further shows mold 144 encloses semiconductor die 114 within a cavity or open space 150. Cavity 150 extends between mold 144 to semiconductor die 114 and interface layer 138. A volume of encapsulant 142 is disposed over semiconductor die 114 and carrier 136. Inlet 148 can be an exhaust port with optional vacuum assist 154 for providing a vacuum in cavity 150; however, inlet 148 does not provide an escape path for encapsulant 142. Encapsulant or molding compound 142 can be a polymer composite material, such as epoxy resin with filler, epoxy acrylate with filler, or polymer with proper filler. The volume of encapsulant 142 is measured according to the space requirements of cavity 150 less the area occupied by semiconductor die 114 and any additional semiconductor devices that might be present. Encapsulant 142 is disposed over semiconductor die 114 and between sidewalls 146. Top portion 145 of mold 144 can move along sidewalls 146 toward encapsulant 142 and semiconductor die 114 until the top portion contacts the encapsulant to evenly disperse and uniformly distribute encapsulant 142 within cavity 150 around semiconductor die 114. A viscosity and elevated temperature of encapsulant 142 can be selected for uniform coverage, for example, a lower viscosity and elevated temperature can increase the flow of the encapsulant for molding, paste printing, and spin coating. The temperature of encapsulant 142 can also be controlled within cavity 150 to promote curing of the encapsulant. Semiconductor die 114 are embedded together in encapsulant 142, which is non-conductive and environmentally protects the semiconductor die 114 from external elements and contaminants, to form panel, plastic panel, embedded die panel, reconstituted panel, reconstituted wafer, molded panel, or molded wafer 158. As such, the embedded die panel 158 can be formed by encapsulating at least four sides surfaces 124 and the active surface 120 of the first semiconductor die 114a, the second semiconductor die 114b, and the side surfaces 127 of the conductive interconnects 128 with encapsulant 142 in a single step, in a same process, or at a same time.

FIG. 2D shows an encapsulation process similar to the process described in relation to FIG. 2C. FIG. 2D differs from FIG. 2C by the orientation of semiconductor die 114 relative to carrier 136 and adhesive 138. Instead of mounting semiconductor die 114 face up with active surface 120 oriented away from carrier 136 as shown in FIG. 2C, FIG. 2D shows an embodiment in which semiconductor die 114 are mounted face down with active surface 120 oriented toward carrier 136. Accordingly, adhesive 141 can be omitted from over back surface 118 of semiconductor die 114. Furthermore, while the processing shown subsequently in FIGS. 2E-2L is shown with respect to the packaging of semiconductor die 114 illustrated in FIG. 2C, the subsequent processing is likewise applicable to the packaging illustrate in FIG. 2D.

Figure 2E:
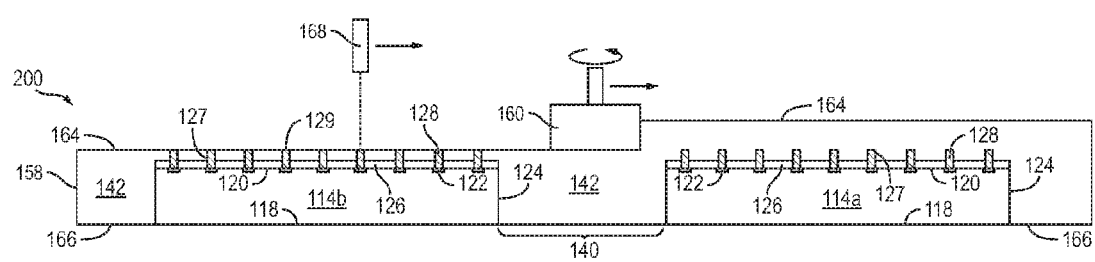

In FIG. 2E, semiconductor die 114 are removed from mold 144 as part of the panel 158, and the molded wafer 158 can optionally undergo a curing process to cure encapsulant 142. Carrier 136 and adhesive 138 can be removed immediately or soon after removal from the mold 144 and before subsequent processing. Alternatively, the carrier 136, the interface layer 138, or both, can be removed after subsequent processing, such as after the formation of build-up interconnects structure 170. In any event, the carrier 136 and the interface layer 138 can be removed by chemical etching, mechanical peeling, CMP, mechanical grinding, thermal bake, UV light, laser scanning, or wet stripping to expose encapsulant 142.

A front surface or first surface 164 of encapsulant 142 can be substantially coplanar with ends 129 of conductive interconnects 128, as discussed in greater detail below. A back surface or second surface 166 of encapsulant 142, opposite the first surface 164, can be substantially coplanar with adhesive 141 or back surface 118 of the semiconductor die 114. Alternatively, the back surface 166 of the encapsulant 142 can be substantially non-coplanar or offset with respect to the backsides 118 of the semiconductor die 114, because of the semiconductor die 114 being depressed or recessed within the adhesive 138. The offset can be a distance greater than 10 µm, and can also be in a range of 10-20 µm. Both the encapsulant 142 and the backsides 118 of the semiconductor die 114 can be exposed by the removal of the carrier 136 and interface layer 138. The embedded die panel 158 can includes a footprint or form factor of any shape and size that allows for, and facilitates, the subsequent processing required to form the final semiconductor device or package, as described in greater detail below. In an embodiment, panel 158 includes a form factor similar to the form factor of a 300 millimeter (mm) semiconductor wafer and includes a circular footprint having a diameter of 300 mm. However, other diameters, including 200 mm, 400 mm, and any other suitable size diameter can also be used. The form factor or footprint of the panel 158 can also be square, rectangular, or of any other suitable shape.

FIG. 2E also shows panel 158 undergoes an optional grinding operation with grinder 160 to planarize the surface and reduce a thickness of the panel 158. A chemical etch can also be used to remove and planarize a portion of encapsulant 142 in panel 158. Thus, a surface or end 129 of interconnect structures 128 is exposed with respect to encapsulant 142, opposite attachment of the interconnects structures 128 being attached to contact pads 122, to provide for electrical connection between semiconductor die 114 and a subsequently formed fine-pitch build-up interconnect structure. The sides or sidewalls of the conductive interconnects 128 can extend between the contact pads 122 and the ends 129 along the height H1 of the conductive interconnects 128, the sides 127 being covered or in contact with the encapsulant.

With exposure of the ends 129 of interconnects 128 from the encapsulant 142, the panel 159 can be scanned, imaged, or otherwise measured with a scanner or imager 168 to determine the position, orientation, or both, of each semiconductor die 114 and conductive interconnects 128, as set forth in U.S. patent application Ser. Nos. 14/930,514 and 15/219,025, the entirety of the disclosure of which are hereby incorporated by reference.

Figure 2F:
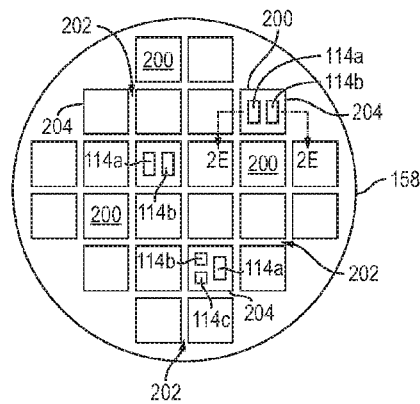

FIG. 2F shows a plan view of the panel 158 comprising a plurality of the multi-die packages 200, before the formation of the build-up interconnect structures 170 are formed as part of the packages 200 and before the packages 200 are singulated from the panel 158. A portion of the plan view shown in FIG. 2F is marked with a section line 2E-2E, which indicates an exemplary package 200 within the molded panel 158 that can correspond to the cross-sectional profile view of FIG. 2E. However, any of the packages 200 could also be represented in the profile view of FIG. 2E and the other profile views. Additionally, while FIG. 2E shows an unfinished and unsingulated package 200, before the formation of the build-up interconnect structures 170, a person of ordinary skill in the art will recognize that the packages 200 in FIG. 2F can also correspond to the finished packages shown in 2L. While for convenience only a portion of the packages 200 in FIG. 2F are shown with the semiconductor die 114 (such as 114a and 114b) being shown within the package perimeters 204, each of the multi-die packages 200 can comprise two or more semiconductor die 114.

For simplicity, the cross-sectional views of the multi-die packages 200 show two semiconductor die 114, such as a semiconductor die 114a and 114b. However, any desirable number of multiple semiconductor die or components 114 can be included within the packages 200, including three, four, five, or more semiconductor die or components. As a non-limiting example, FIG. 2F also shows a plan view of a package 200 comprising three semiconductor die 114, including a semiconductor die 114c. For whatever number of multiple semiconductor die 114 included within each package 200, the semiconductor die 114 can comprise a corresponding prestratum, similar to prestratum 210, 220 that are aligned (rotated, shifted, or both) and shown e.g. in FIG. 2K and described herein. Thus, a third semiconductor die 114c would comprise a third prestratum like prestratum 210, 220, and a fourth semiconductor die 114 would comprise a fourth prestratum like prestratum 210, 220, and so forth for any number of semiconductor die included within the multi-die package 200. In any event, the multi-die packages 200 can comprise a single fixed prestratum 230 that is coupled with unit specific routing 240 to all of the semiconductor die 114 and the corresponding prestratum for each of the semiconductor die 114, no matter the number of semiconductor die, whether two, three, four, or any other desirable number of semiconductor die and corresponding prestratums. Thus, only one fixed prestratum 230 may be sufficient for any number of semiconductor die 114 and prestratums 210, 220, while in other instances the single fixed prestratum 230 can be subdivided into multiple fixed prestratum or multiple fixed prestratums 230 can be used.

Figure 2G:
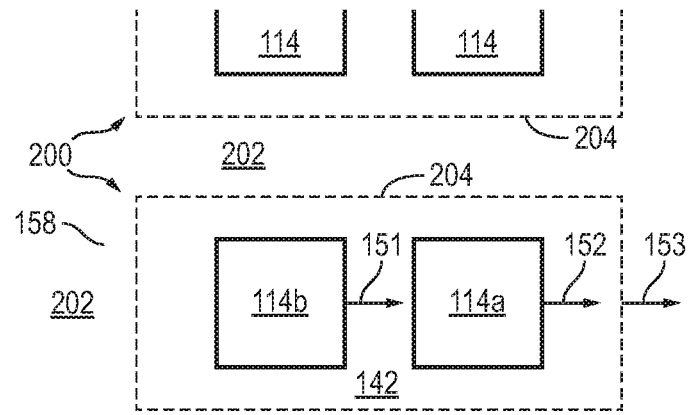
Figure 2H:
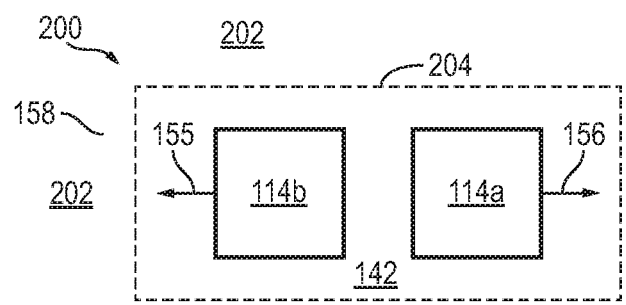
Figure 2I:
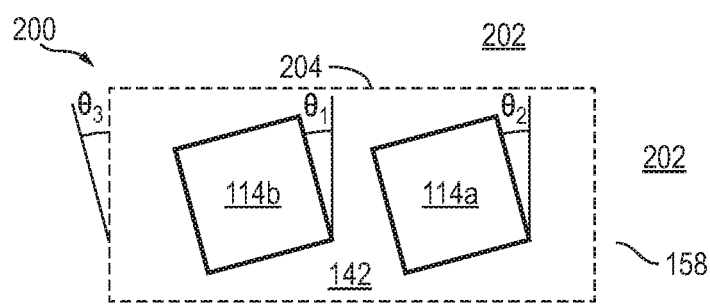

FIGS. 2G-2I show various plan views for portions of panel 158, including three exemplary scenarios for die shift, or the relative movement of semiconductor die 114a and 114b, with respect to each other. The relative movement of the semiconductor die 114, such as for semiconductor die 114a and 114b, can occur during the molding or encapsulating process described above with respect to FIGS. 2C and 2D. The relative movement of the semiconductor die 114 shown in FIGS. 2G-2I could occur for the same semiconductor die 114 under different circumstances or scenarios of package formation, the differences occurring in unpredictable ways under similar circumstances for the same semiconductor die 114 being molded or encapsulated with encapsulant 142. Additionally, the relative movement of the semiconductor die 114 shown in FIGS. 2G-2I could occur for different pairs or groupings of semiconductor die 114 that will form different packages, multi-die packages, or molded core units 200 that are being processed together as part of the same panel 158, as shown e.g. in FIG. 2F.

FIG. 2G shows a first scenario in which a core unit or multi-die package 200 comprises semiconductor die 114a and 114b that undergo or have undergone a uniform die shift. The semiconductor die 114b has undergone an XY shift 151 in a first direction, or to the right as shown by arrow 151, a certain or fixed distance and direction. The semiconductor die 114a has undergone an XY shift 152 in a second direction, or to the right as shown by arrow 152, a certain or fixed distance and direction, which can be similar, identical, or substantially identical to the first XY shift 151. When both the XY shift 151 and the XY shift 152 are similar, identical, or substantially identical, such as when the semiconductor die 114a and 114b are shifting in a same direction, or substantially the same direction and for the same distance or for substantially same distance, the XY shift 151 and the XY shift 152 do not produce a cumulative effect of an increased shift, displacement, or movement with respect to a package outline or perimeter 204 of the multi-die package 200. Instead, because the semiconductor die 114 move with a same or similar XY shift, the package outline 204 can have an XY shift 153 together with the semiconductor die shift 151, 152, so long as it is within a tolerance of the saw streets 202. As such, the XY shift 153 of the package outline 204 accommodates for the XY shifts 151, 152 and no additional changes or accommodations need to be made to the subsequently formed build-up interconnect structure 170, shown for example in FIG. 2J.

FIG. 2H, similar to FIG. 2G, shows a second scenario of semiconductor die shift for two semiconductor die 114 within a multi-die package 200. However, rather than the XY semiconductor die shift being similar or identical for both semiconductor die 114, as was the case in FIG. 2G, FIG. 2H shows an example of non-uniform semiconductor die shift. More specifically, FIG. 2H shows a multi-die package 200 with a worst-case non-uniform die shift in which the semiconductor die 114b has undergone an XY shift 155 in a first direction, or to the left as shown by arrow 155, a certain or fixed distance and direction, and the semiconductor die 114a has undergone an XY shift 156 in a first direction, or to the right as shown by arrow 156, a certain or fixed distance and direction. In other words, the XY shift for the package 200 is maximized because the XY semiconductor die shift 155, 156 are in opposite directions so that total relative XY shift of the semiconductor die 114 within the package is the sum of the XY semiconductor die shift 155 and the XY semiconductor die shift 156. As a result, under conventional packaging, excessive shifting, such as that shown in FIG. 2H, results in yield loss for the package 200 and the semiconductor die 114a, 114b unless the design rules for the subsequently formed build-up interconnect structure 170 are doubled from the case of single XY semiconductor die shift. Stated another way, the XY semiconductor die shifting 155, 156 in opposite directions (to the left and right respectively) produces a cumulative effect with respect to the multi-die package 200, that with conventional processing would result in yield loss, such as failure due to multi-die packages 200 that do not have redistribution layer (RDL) capture pads above openings in the via layer that are large enough to account for the cumulative offset resulting from the opposing shifts of the semiconductor die 114.

FIG. 2I, similar to FIGS. 2G and 2H, illustrates another form of relative semiconductor movement that occurs rotationally rather than translationally, wherein the semiconductor die 114 undergo or have undergone a uniform die rotation. The semiconductor die 114b has undergone a first angle of rotation, such as a counterclockwise rotation, shown by the angle $\theta_1$, a certain or fixed number of degrees. The semiconductor die 114a has undergone a second angle of rotation, such as a counterclockwise rotation, shown by the angle $\theta_2$, a certain or fixed number of degrees, which can be similar, identical, or substantially identical to the first angle of rotation $\theta_1$. When both the first angle of rotation angle $\theta_1$ and the second angle of rotation angle $\theta_2$ are similar, identical, or substantially identical, such as when the semiconductor die 114a and 114b are rotating in a same direction, or substantially the same direction and through a same number of degrees, the rotation angle $\theta_1$ and the rotation angle $\theta_2$ do not produce a cumulative effect of an increased rotation or movement with respect to the package outline or perimeter 204 of the multi-die package 200, and the rotation can be compensated for by rotating the outline 204 at an angle $\theta_3$ that is the same or similar to the rotation of angle $\theta_1$ and angle $\theta_2$ thereby compensating for the rotation of the semiconductor die 114. In instances where the angle of rotation of angle $\theta_1$ and angle $\theta_2$ are different, but in a same direction, the outline 204 can be rotated in a same direction and by an average of the two rotations to split the difference of the two rotations, thereby reducing or minimizing the magnitude of the rotations of angle $\theta_1$ and angle $\theta_2$ with respect to the package outlines 204, so long as it is within a tolerance of the saw streets 202. On the other hand, if the semiconductor die 114 are rotated in different directions, like clockwise and counterclockwise, a worse case scenario develops, analogous to that shown translationally in FIG. 2H, and yield loss can result because a rotation of the package outline 204 does not compensate for the opposite rotations of angle $\theta_1$ and angle $\theta_2$.

As described in the disclosure, and in greater detail below, the present system, method, and semiconductor structures comprising both unit specific alignment and unit specific patterning for packages 200 comprising two or more semiconductor die 114 can ameliorate difficulties of yield loss, slow processing times, decreased routing density, increased pitch, and increased capture pad size, that result from movement of semiconductor die 114, such as translational movement in the form of XY semiconductor die shift, rotational movement, such as rotation of an angle $\theta$, or both as shown and described with respect to FIGS. 2G-2I. While FIGS. 2G-2I show either translational movement or rotational movement, in practice one or more semiconductor die 114 will experience both translational and rotational displacement, adding to the problems identified herein. The discussion of how the present system, method, and semiconductor structures comprising both unit specific alignment and unit specific patterning for packages 200 is discussed in greater detail with respect to the build-up interconnect structure 170, exemplary embodiments of which are shown in, and discussed with respect to, FIG. 2J.

Figure 2J:
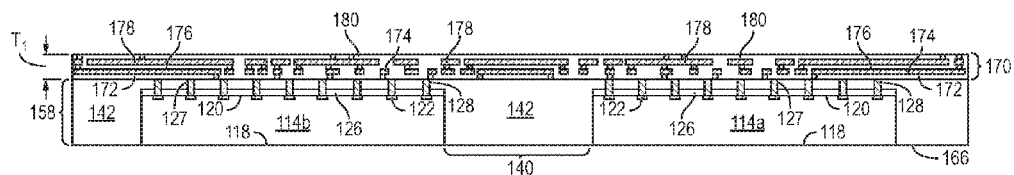

FIG. 2J shows forming a build-up interconnect structure or high density multi-layer RDL routing pattern 170 over the molded panel 158 to electrically connect, and provide routing between, semiconductor die 114, such as 114a and 114b, through conductive interconnects 128. Interconnecting the conductive interconnects 128 of the first semiconductor die 114a and the second semiconductor die 114b can be done over the embedded die panel 158 to form the at least one package, multi-die package, or molded core unit 200. The build-up interconnect structure 170 can be formed to directly contact the conductive interconnects 128, such as ends 129 of the conductive interconnects 128. As used herein the spacing or density of the fine-pitch build-up interconnect structure 170 can comprise line and space width, or pitch, of less 5 µm, less than 3 µm, and also less than 1 µm.

While FIG. 2J shows the build-up interconnect structure 170 comprising three conductive layers and three insulating layers fewer layers or more layers can be used depending on the configuration and design of the various packages 200. The build-up interconnect structure 170 can optionally comprise a first insulating or passivation layer 172 formed or disposed over the reconstituted panel 158. The first insulating layer 172 can comprise one or more layers of $SiO_2$, $Si_3N_4$, SiON, $Ta_2O_5$, $Al_2O_3$, or other material having similar insulating and structural properties. The insulating layer 172 can be formed using PVD, CVD, printing, spin coating, spray coating, sintering or thermal oxidation. Openings or first level conductive vias can be formed through the insulating layer 172 over the conductive interconnects 128 to facilitate connection with the semiconductor die 114.

A first conductive layer 174 can be formed over the reconstituted panel 158 and over the first insulating layer 172 as a first RDL layer to extend through the openings in the first insulating layer 172, to electrically connect with the first level conductive vias, and to electrically connect with the conductive interconnects 128. Conductive layer 174 can be one or more layers of Al, Cu, Sn, Ni, Au, Ag, or other suitable electrically conductive material formed using a patterning and metal deposition process such as sputtering, electrolytic plating, and electroless plating, or other suitable process.

A second insulating or passivation layer 176, which can be similar or identical to the first insulating layer 172, can be disposed or formed over the reconstituted panel 158, the first conductive layer 174, and the first insulating layer 172. An opening or second level conductive via can be formed through the second insulating layer 176 to connect with the first conductive layer 174.

A second conductive layer 178, which can be formed of materials and in ways that are similar or identical to the first conductive layer 174, can be formed as a second RDL layer over reconstituted panel 158, over the first insulating layer 172, over the first conductive layer 174, over the second level conductive via, or within an opening of the second insulating layer 172, to electrically connect with the first conductive layer 174, the first level and second level conductive vias, and the semiconductor die 114.

A third insulating or passivation layer 180, which can be formed of materials and in ways that are similar or identical to the first insulating layer 172, can be disposed or formed over the second conductive layer 178 and the second insulating layer 176. An opening or a third level conductive via can also be formed in or through the third insulating layer 180 to connect with the second conductive layer 178.

Portions of the built-up interconnect structure 170, such as conductive layer 174 and conductive layer 178, can be formed using unit specific patterning (also known as "Adaptive Patterning™" or "Adaptive Routing™"), as well as unit specific alignment (also known as "Adaptive Alignment™"), or both, in such a way that both unit specific alignment and unit specific patterning can together enable economic fabrication of multi-die packages 200 with minimal design variation and significantly reduced yield loss. As used herein, the term or phrase unit specific alignment comprises a method of unit specific patterning in which RDL designs and via layer designs of a package (or portions of such layers) like conductive layer 174 and conductive layer 178, are translated, rotated, or both, on a per unit or per semiconductor die basis, to align the RDL layer designs and via layer designs to desired electrical connections, such as electrical connections on semiconductor die 114, or on other layers of semiconductor packaging or devices below the RDL layer designs and via layer designs. On the other hand, unit specific patterning comprises a method of patterning conductive layers (or portions thereof), such as conductive layer 174 and conductive layer 178, in which an auto-router, such as a maze router or topological router, completes routes between points, such as translated-rotated-points, on the RDL layer designs 174, 178 on a per semiconductor die 114 or per package 200 basis. The unit specific patterning for multi-die packages 200 can be customized to connect with multiple fixed or unit specific aligned RDL sections coupled among multiple semiconductor die 114 and portions of the build-up interconnect structure 170.

Conventional methods for patterning multi-semiconductor die packages do not adjust the via layer or RDL layer to compensate for semiconductor die misalignment or semiconductor die shift during processing. Instead, RDL capture pads above openings in the via layer are made large enough to account for semiconductor die shift during processing while retaining high process yield. Accordingly, many process rely on low-speed, high-accuracy semiconductor die attach tools to reduce or minimize semiconductor die shift, while also increasing or maximizing interconnect density by reducing a size required for the via capture pads.

As a result of the conventional methods of making multi-die packages, larger design rule values than those needed for the present method have been needed to account for semiconductor die shift. Thus, conventional methods can prohibit or preclude designs with dense RDL interconnects. Additionally, even if designs including dense RDL interconnects are technically feasible using high-accuracy die attach tools, use of the high-accuracy die attach tools can expensive, slow, and economically prohibitive for medium to small body size packages or packages with many integrated semiconductor die. Furthermore, while integrated passives, or integrated passive devices (IPDs), can be placed with lower accuracy, and can be included within the semiconductor packages without reducing routing densities or increasing sizes of RDL capture pads, typical die pad pitch requires precision alignment to the via layer. Therefore, as a general rule, higher speed die-attach tools as well as dense design rules can result in increased or significant yield loss of semiconductor die packages.

To reduce yield loss in semiconductor die packaging, advanced manufacturing technologies can be used in package formation to align to each package individually, or to a group of packages within a reticle, thereby compensating at least partially for shifts of semiconductor die on a group basis. However, because multiple semiconductor die can shift independently of each other during packaging, the necessary compensation for the shifting of the multiple semiconductor die within a single package has not been sufficiently addressed and can include shifts that are double or twice the maximum shift of a single semiconductor die 114, as discussed with respect to FIGS. 2G-2I, thereby resulting in lost yield of packaged semiconductor die. Improved compensation for the shifting of multiple semiconductor die 114 within a single package 200, such as within a larger group or array of packages 200 in a panel 158 is discussed below and with respect to FIG. 2K.

FIG. 2K shows an example of a conductive layer or redistribution layer 174, 178, as part of the build-up interconnect structure 170 formed as part of multi-die packages 200, wherein the layer 174, 178 comprises a unit specific structure that has been individualized or adapted to the particular shifts and movements of the semiconductor die 114. The unit specific structure of the conductive layers 174, 178 can comprise a first unit specific alignment portion or prestratum 210, a second unit specific alignment portion or prestratum 220, a third fixed portion or prestratum 230, and a unit specific routing portion 240. The first prestratum 210 is shown in FIG. 2K on the left side of the figure, while the second prestratum 220 is shown in FIG. 2K on the right side of the figure, and the third or fixed prestratum 230 is shown at a center of FIG. 2K between the first prestratum 210 and the second prestratum 220. The unit specific patterning traces 240 are also shown at a center of FIG. 2K connecting and extending between the first prestratum 210 and the second prestratum 220, as well as between the first prestratum 210 and the fixed prestratum 230 and the second prestratum 220 and the fixed prestratum 230. Taken together, the first prestratum 210, the second prestratum 220, the fixed prestratum 230, and the unit specific routing portion 240 can form a single planar conductive layer 174, 178 within the build-up interconnect structure 170.

The first prestratum 210 can be a predefined section of a design, routing design, RDL, or conductive layer 174, 178. The first prestratum 210, like any of the other prestratums, can comprise an underbump pad, via capture pad, contact pad, or pad 212, a trace or routing line 214, and a via capture pad, underbump pad, contact pad, or pad 216. When the first prestratum 210 is formed as part of the first conductive layer 174 as a layer within the build-up interconnect structure 170, the pad 212 can be a via capture pad for providing direct contact with a subsequently formed electrical interconnect structure, such as a conductive via or part of the second conductive layer 178. Additionally, the via capture pad 216 can directly contact or be coupled to the ends 129 of the conductive interconnects 128 at their actual or measured positions after shifting has occurred. When the first prestratum 210 is formed as part of the second conductive layer 178 within the build-up interconnect structure 170, the pad 212 can be a via capture pad for providing direct contact with a subsequently formed electrical interconnect structure, such as a conductive via or part of the second conductive layer 178. The pad 212 can also be an underbump metallization (UBM) pad, similar to, or connected with, pad 182. Additionally, the via capture pad 216 can directly contact or be coupled to a conductive via, can be formed to included a conductive via, and can directly contact, or be coupled to, a pad on another conductive layer within the build-up interconnect structure, such as a via pad 212 of conductive layer 174.

Multiple conductive layers, such as both conductive layers 174 and 178 can each include first prestratums 210, and be shifted or adjusted to account for a portion of the misalignment between the design position and the actual measured position of the semiconductor die 114 within the package 200, and as measured with respect to package outline 204. In such instances, the first prestratums 210 of the multiple conductive layers 174, 178 can be vertically offset from each other as multiple layers within the same build-up interconnect structure 170. Each part of the first prestratum 210 (e.g. 212, 214, 216) can be shifted or transformed together to match a shifted or measured positions of a semiconductor die 114, being both translated and rotated to match the shift of the semiconductor die 114b.

The second prestratum 220 can be aligned to the semiconductor die over which it is formed, such as semiconductor die 114a, in the same manner as the first prestratum 210 is aligned with the semiconductor die 114b. The second prestratum 220 can be a predefined section of a design, artwork, routing design, RDL, or conductive layer 174, 178. The second prestratum 220, like any of the other prestratums, can comprise an underbump pad, via capture pad, contact pad, or pad 222, a trace or routing line 224, and via capture pad, underbump pad, contact pad, or pad 226. When the first prestratum 220 is formed as part of the first conductive layer 174 as a layer within the build-up interconnect structure 170, the pad 222 can be a via capture pad for providing direct contact with a subsequently formed electrical interconnect structure, such as a conductive via or part of the second conductive layer 178. Additionally, the via capture pad 226 can directly contact or be coupled to the ends 129 of the conductive interconnects 128 at their actual or measured positions after shifting has occurred. When the first prestratum 220 is formed as part of the second conductive layer 178 as a layer within the build-up interconnect structure 170, the pad 222 can be a via capture pad for providing direct contact with a subsequently formed electrical interconnect structure, such as a conductive via or part of the second conductive layer 178. The pad 222 can also be a UBM pad, similar to, or connected with, pad 182. Additionally, the via capture pad 226 can directly contact or be coupled to a conductive via, can be formed to included a conductive via, and can directly contact, or be coupled to, a pad on another conductive layer, within the build-up interconnect structure 170, such as a via pad 222 of conductive layer 174.

Multiple conductive layers, such as conductive layers 174 and 178, can each include first prestratums 210 that can be shifted or adjusted to account for a portion of the misalignment between the design position and the actual measured position of the semiconductor die 114 within the package 200, as measured with respect to package outline 204. In such instances, the first prestratums 210 of the multiple conductive layers 174, 178 can be vertically offset from each other as multiple layers within the same build-up interconnect structure 170.

Each part of the first prestratum 210 (e.g. 212, 214, 216) can be shifted or transformed together to match a shifted or measured positions of a semiconductor die 114. The first prestratum 210 can be both translated and rotated to match the shift of the semiconductor die 114b. As such, alignment of the multiple prestratums 210, 220 to respective semiconductor die 114a and 114b within the multi-die package 200 can include alignment to XY shift of the semiconductor die 114, alignment to rotation of the semiconductor die 114, or both.

The third prestratum 230 need not be aligned to either semiconductor die 114a, 114b, or with either the first prestratum 210 or the second prestratum 220, but rather can be fixed in a position relative to the package outline 204 or edge of the multi-semiconductor die package 200. Stated another way, the third prestratum 230 can comprise a position within the multi-die package 200 that is independent of shifting positions of the semiconductor die 114 within the multi-die package 200.

The unit specific patterning portion 240 (shown in black solid lines in FIG. 2K) connects, and extends between, the first unit specific alignment portion or prestratum 210, the second unit specific alignment portion or prestratum 220, and the fixed portion or prestratum 230. The unit specific patterning portion 240 can be generated by an auto-router that routes between endpoints 242, 244 after transformation of the endpoints 242, 244 by a shift corresponding to the shift of the first prestratum 210 and the second prestratum 220, respectively, or according to a shift of the semiconductor die 114. As such, each endpoint 242, 244 can have a separate transformation, or no transformation (being fixed relative to an edge or outline 204 of the multi-die semiconductor package 200) such as with the third prestratum 230.

Figure 3:
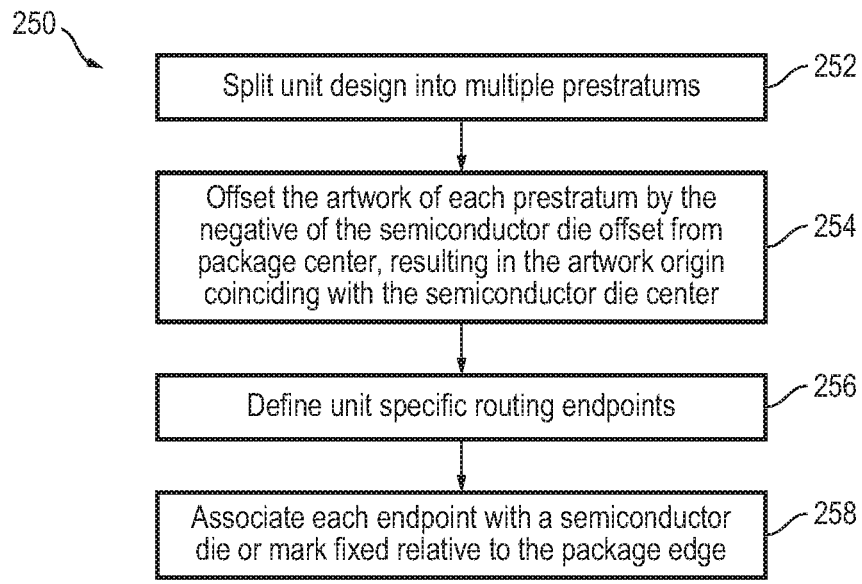
FIG. 3 illustrates a flow chart for part of a process of forming a semiconductor device or package.

During formation of the multi-die package 200, a first set of actions or steps 252-258 of the method of formation 250 that can occur during the design process, and before actual construction or physical creation, which are shown and discussed in greater detail with respect to FIG. 3. Similarly, a second set of actions or steps 302-308 of the method of formation 300 that can occur during processing of packages 200 on a per-panel or on a per-unit basis are shown and discussed in greater detail with respect to FIG. 4.

Figure 2L:
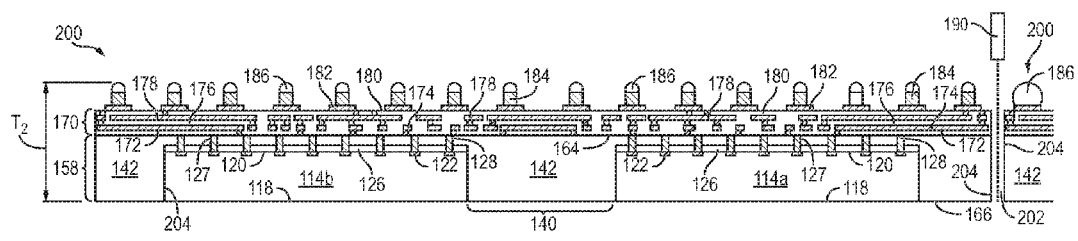

As shown in FIG. 2L, a third conductive layer or UBM 182 can be formed after the formation of build-up interconnect structure 170, or as part of it. The UBM 182 can be formed over the third insulating layer 180 and the third level conductive via to electrically connect with the other conductive layers and conductive vias within the build-up interconnects structure 170, as well as electrically connect to the semiconductor die 114, the conductive interconnects 128, and the conductive interconnects 52. UBMs 182, like all of the layers, plating layers, or conductive layers formed by a plating process as presented herein, can be a multiple metal stack comprising one or more of an adhesion layer, barrier layer, seed layer, or wetting layer. The adhesion layer can comprise titanium (Ti), or titanium nitride (TiN), titanium tungsten (TiW), Al, or chromium (Cr). The barrier layer can be formed over the adhesion layer and can be made of Ni, NiV, platinum (Pt), palladium (Pd), TiW, or chromium copper (CrCu). In some instances, the barrier layer can be a sputtered layer of TiW or Ti and can serve as both the adhesion layer and the barrier layer. In either event, the barrier layer can inhibit unwanted diffusion of material, like Cu. The seed layer can be Cu, Ni, NiV, Au, Al, or other suitable material. For example, the seed layer can be a sputtered layer of Cu comprising a thickness of about 2,000 angstroms (e.g., 2,000 plus or minus 0-600 angstroms).

The seed layer of UBM 182 can be formed over the barrier layer and can act as an intermediate conductive layer below subsequently formed interconnect structures, posts, pillars, or columns 184 and bumps or balls 186. In some instances, bumps 186 can be formed without the interconnect structures 184, and the wetting layer can comprise a layer of Cu with a thickness in a range of about 5-11 μm or 7-9 μm. Bumps 186, such as when formed of SnAg solder, can consume some of the Cu UBM 182 during reflow and forms an intermetallic compound at the interface between the solder bump 184 and the Cu of the wetting layer. However, the Cu of the wetting layer can be made thick enough to prevent full consumption of the Cu pad by the solder during high temperature aging. In some instances, the UBMs 182 can comprise Ni, Pd and Au. UBMs 182 can provide a low resistive interconnect to build-up interconnect structure 170 as well as a barrier to solder diffusion and seed layer for solder wettability. The completed interconnect structure 170 can comprise overall thickness $T_1$ in a range of 5 μm-12 μm, 12 μm-25 μm, or 25 μm-70 μm. The planarity of the fine-pitch interconnect structure 170 can be less than or equal to 10 μm, which can be equal to a planarity of the panel 158.

FIG. 2L also shows that after the formation of the interconnect structure 170, interconnect structures 184, and bumps 186, panel 158 can be singulated through saw streets 202 using a saw blade or laser cutting tool 190 to form one or more, or plurality, of multi-die packages 200. The packages 200 can comprise a thickness or height T2 in a range of 0.15-1.1 millimeters (mm), with the maximum thickness of about 1.1 mm and a minimum thickness of about 0.15 mm, wherein about can equal a percent difference less than or equal to 20%, 10%, or 5%.

FIG. 3 shows a flow chart 250 showing a non-limiting example of design-time actions or steps (252-258) for the formation of multi-die packages 200 using unit specific patterning. In some instances, a first portion of the present method (e.g. elements 252-258) can occur once during the design process for a particular device or package 200, and then be re-used or applied to numerous copies of the particular device or package 200. First, element 252 represents the conductive layer 173, 178 can be split into multiple specific alignment portions or prestratums 210, 220, 230, and 240, usually near the gap 140 between the multiple semiconductor die 114, such as between the first semiconductor die 114a and the second semiconductor die 114b, for a multi-die package, 200. Each portion 210, 220, 230, and 240 of the conductive layers 174, 178 can be assigned to shift with a specific semiconductor die 114 or to not shift at all. In some instances, additional prestratum or unit specific alignment portions can be created or divided out, based on additional needs or technical requirements relating to underlying or related structures. For example, an prestratum or pattern above a semiconductor die feature (such as an inductor) may need to closely align with a particular portion of an underlying semiconductor die 114, while the rest of the prestratum or pattern can move or be fixed separately.

Second, element 254 represents that each prestratum, alignment portion, or section of artwork (210, 220, 230, and 240), after having been divided, can then be transformed to a coordinate space suitable for aligning to corresponding semiconductor die 114. Each shifting prestratum, such as 210, 220, which are usually designed in a coordinate space with an origin of the prestratum 210, 220 at a center of the package 220, can be offset such that the center of the prestratum 210, 220 (or the artwork origin of the individual prestratum 210, 220) is at the center of an assigned semiconductor die 114. As such, when the prestratum 210, 220 are rotated or shifted by the measured rotation or shift of the semiconductor die 114, the prestratum 210, 220 will align to their respective semiconductor die 114. Prestratum or artwork that is not shifted to match assigned semiconductor die 114 or feature locations, such as prestratum 230, may remain at a fixed position with respect to the center of the package 200 or the edge 204 of the package 200, so as to not be offset.

Third, element 256 represents the unit specific routing portion or patterning traces 240 that are disposed between and connect the moving prestratums, such as prestratum 210, prestratum 220, and the prestratum 230, can have endpoints 242, 244 together with desired trace widths defined.

Fourth, element 258 represents each endpoint 242, 244 for each of the routing portions 240 can be assigned to shift, rotate, move, or remain fixed with a specific semiconductor die 114 or prestratum 210, 220, and 230. Thus, unit specific routing portions 240 can connect shifted portions to other shifted portions, or connect a shifted portion to a fixed portion of the pattern or artwork, such as prestratum 210, 220, and 230.

Figure 4:
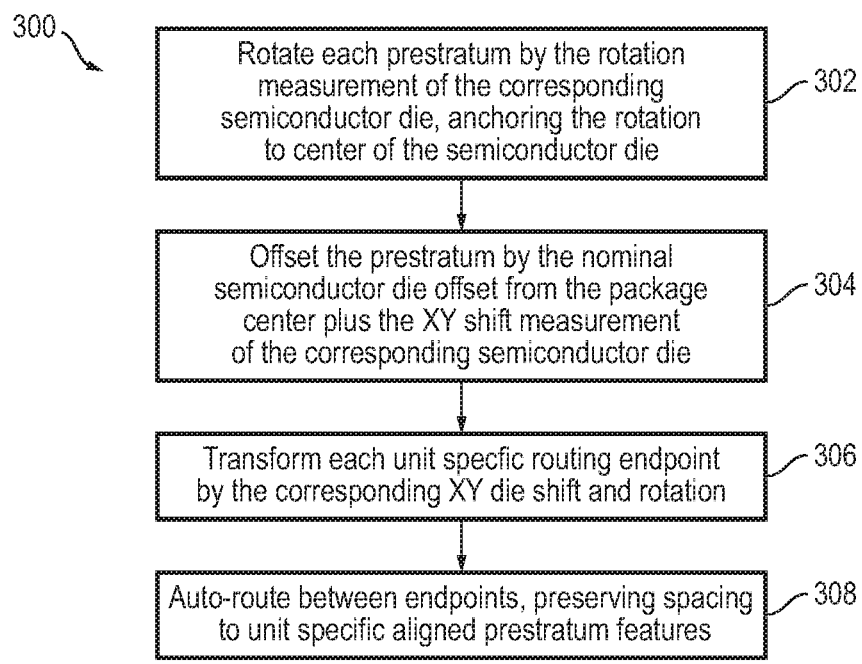
FIG. 4 illustrates a flow chart for another part of a process of forming a semiconductor device or package

FIG. 4 shows a flow chart 300 showing a non-limiting example of actions or steps (302-308) for the formation of multi-semiconductor die packages 200 using unit specific patterning. A second portion of the present method (e.g. elements 302-308) can occur after the design process shown in FIG. 3, and during the per-panel processing that is done as part of the unit specific patterning process, in which the shifted prestratums 210, 220, fixed prestratums 230, and unit specific routing 240 are combined to form the final pattern or conductive layers 174, 178. First, element 302 represents each prestratum 210, 220 is rotated about the origin or center of a corresponding semiconductor die 114 by a corresponding measure of the rotation of the corresponding semiconductor die 114, wherein the rotation of the prestratum 210, 220 is anchored to the center of the respective semiconductor die 114.

Second, element 304 represents the rotated prestratums 210, 220 are is instantiated or offset from the package center by the semiconductor die offset plus the measured XY shift of the semiconductor die 114.

Third, element 306 represents the endpoints 242, 244 of unit specific routing portions 240 can be transformed by the measured shift and rotation of the each of the assigned die 114 or the shift and rotation of the prestratums 210, 220. In some instances, a number of the endpoints 242, 244 not assigned to a semiconductor die 114 or prestratums 210, 220 are not transformed and can remain fixed with respect to a package edge or package outline 204 of the package 200, as well as a center of the package 200 or other desirable feature.

Fourth, element 308 represents the auto-router can complete the traces or unit specific routing portions 240 between desired points such as end points 242, 244, as well preserving spacing among prestratums 210, 220, and 230, as well as enforcing desired design rules as necessary.

The auto-router can enforce design rules (such as minimum spacing) against the geometry of the prestratums 210, 220, and 230 after transformation by the measured semiconductor die shift. To avoid large resident memory usage, the points of polygons within prestratum 210, 220, 230 can be transformed only when the auto-router is evaluating points nearby, where nearby can comprise a minimum spacing between features, or separation, of at least 10 µm or at least 12 µm or other desirable distance according to the configuration and design of the package. Otherwise, data associated with or capturing the points of polygons can be ignored in calculating the routed path of the unit specific routing portion 240, thereby simplifying the calculation for the auto-routed pattern. As such, the transformation by the shift and rotation of semiconductor die 114 is only performed on shapes along the routed path 240, minimizing both computation and memory usage.

Forming multi-die packages 200 using both unit specific alignment and unit specific patterning, as described herein, can provide benefits based on one of more of the following features: (i) aligning multiple predefined prestratum patterns, e.g. 210, 220, to multiple semiconductor die and using unit specific routing portions 240 to connect therebetween; (ii) using unit specific routing portions 240 to connect from a first shifted prestratum 210 to another shifted prestratums 220 and from shifted prestratums 210, 220 to fixed features 230; and (iii) allowing some portions of a design above each semiconductor die 114 to remain fixed relative to the package 200 while others are shifted to align more closely with the semiconductor die 114.

The advantages can include use of unit specific patterning for multi-semiconductor die packages 200 while minimizing variability and retaining dense design rules (allowable spacing and trace size), and minimizing variability and retaining dense design rules while the allowable shift of semiconductor die 114 is increased or maximized. The allowable shift of semiconductor die 114 is increased or maximized because portions of RDL patterns or the conductive layers 174, 178 in build-up interconnect structure 170, such as prestratum 210, 220 above semiconductor die 114a, 114b can be aligned separately. As such, when two semiconductor die 114a, 114b shift in opposite directions, each prestratum 210, 220 only accounts for the shift of one corresponding semiconductor die 114a or 144b. To the contrary, with other approaches if the entire pattern 174, 178 needs to be aligned, the effective magnitude of semiconductor die shift would be double since the semiconductor die 114 are moved in opposite directions, as illustrated in FIG. 2G. As a result, less computer memory, fewer computing resources, and less time can be allocated to determining a completely new pattern, including final RDL and via patterns for conductive layers 174, 178, for each of the multi-semiconductor die packages 200 by using the present method, rather than using auto routing for an entirety of the package.

In the foregoing specification, various embodiments of the disclosure have been described. It will, however, be evident that various modifications and changes may be made thereto without departing from the broader spirit and scope of the inventions as set forth in the appended claims. The specification and drawings are, accordingly, to be regarded in an illustrative sense rather than a restrictive sense.

What is claimed is:

1. A method of making a semiconductor device, comprising:
    forming an embedded die panel by encapsulating at least four side surfaces and an active surface of a first semiconductor die, a second semiconductor die, and side surfaces of conductive interconnects coupled to the first semiconductor die and the second semiconductor die with encapsulant in a single step;
    measuring an actual position of the first semiconductor die and an actual position of the second semiconductor die within the embedded die panel to obtain a rotation measurement of the first semiconductor die, a XY shift of the first semiconductor die, a rotation measurement of the second semiconductor die, and a XY shift of the second semiconductor die;
    interconnecting the conductive interconnects of the first semiconductor die and the second semiconductor die by forming a build-up interconnect structure over the embedded die panel, the build-up interconnect structure being formed by:
        forming a first unit specific alignment portion aligned with the first semiconductor die,
        forming a second unit specific alignment portion aligned with the second semiconductor die,
        forming unit specific routing connecting the first unit specific alignment portion and the second unit specific alignment portion, and
        forming a fixed portion aligned with a package outline and coupled to the unit specific routing,
        wherein the first unit specific alignment portion, the second unit specific alignment portion, the unit specific routing connecting the first unit specific alignment portion and the second unit specific alignment portion, and the fixed portion aligned with an outline of the embedded die panel are within a single planar conductive layer; and
    singulating the embedded die panel to form the semiconductor device with the first semiconductor die and the second semiconductor die disposed within the package outline and interconnected with the build-up interconnect structure.

2. The method of claim 1, further comprising adjusting a design of the build-up interconnect structure before forming the build-up interconnect structure over the embedded die panel by:
    splitting the build-up interconnect structure into multiple portions, including the first unit specific alignment portion and the second unit specific alignment portion;
    defining a plurality of unit specific routing endpoints for each of the first unit specific alignment and the second unit specific alignment; and
    assigning each of the plurality of unit specific routing endpoints to a segment of the first unit specific alignment portion, a segment of the second unit specific alignment portion, or a mark fixed relative to a package edge;
    wherein the build-up interconnect structure comprises a fine-pitch of less than 5 μm.

3. The method of claim 2, further comprising:
    forming the embedded die panel comprising a third semiconductor die;
    forming a third unit specific alignment portion aligned with the third semiconductor die; and
    forming the unit specific routing connecting the third unit specific alignment portion to the first unit specific alignment portion and the second unit specific alignment portion.

4. The method of claim 2, further comprising adjusting the design of the build-up interconnect structure before forming the build-up interconnect structure over the embedded die panel by:
    rotating the first unit specific alignment portion by the rotation measurement of the first semiconductor die;
    shifting the first unit specific alignment portion by the XY shift of the first semiconductor die;
    rotating the second unit specific alignment portion by the rotation measurement of the second semiconductor die;
    shifting the second unit specific alignment portion by the XY shift of the second semiconductor die; and
    forming the unit specific routing connecting the first unit specific alignment portion and the second unit specific alignment portion by auto-routing between the unit specific routing endpoints for each of the first unit specific alignment and the second unit specific alignment while preserving minimum spacing between the unit specific routing connections.

5. The method of claim 1, wherein a rotation or XY shift of the build-up interconnect structure is no greater than the rotation measurement of the first semiconductor die, the XY shift of the first semiconductor die, the rotation measurement of the second semiconductor die, and the XY shift of the second semiconductor die.

6. The method of claim 1, further comprising forming the embedded die panel by:
    providing a temporary carrier comprising an adhesive disposed over a top surface of the temporary carrier;
    providing a first semiconductor die comprising conductive interconnects coupled to an active surface of the first semiconductor die;
    providing a second semiconductor die comprising conductive interconnects coupled to an active surface of the second semiconductor die; and
    mounting the first semiconductor die and the second semiconductor die face up to the temporary carrier.

7. A method of making a semiconductor device, comprising:
    forming an embedded die panel;

measuring an actual position of a first semiconductor die and an actual position of a second semiconductor die within the embedded die panel to obtain a rotation measurement and XY shift for the first semiconductor die and the second semiconductor die;

interconnecting the first semiconductor die and the second semiconductor die by forming a build-up interconnect structure over the embedded die panel, the build-up interconnect structure being formed by:

forming a first prestratum aligned with the first semiconductor die, forming a second prestratum aligned with the second semiconductor die, and forming unit specific routing connecting the first prestratum and the second prestratum; and singulating the embedded die panel to form the semiconductor device with the first semiconductor die and the second semiconductor die disposed within a package outline and interconnected with the build-up interconnect structure.

8. The method of claim 7, further comprising forming a fixed portion aligned with outline of embedded die panel and coupled to the unit specific routing.

9. The method of claim 7, further comprising:

splitting the build-up interconnect structure into multiple portions, including the first prestratum and the second prestratum;

defining a plurality of unit specific routing endpoints for each of the first prestratum and the second prestratum; and assigning each of the plurality of unit specific routing endpoints to the first prestratum, the second prestratum, or a prestratum fixed relative to a package edge.

10. The method of claim 7, further comprising adjusting the design of the build-up interconnect structure before forming the build-up interconnect structure over the embedded die panel by:

rotating the first prestratum by the rotation measurement of the first semiconductor die;

shifting the first prestratum by the XY shift of the first semiconductor die;

rotating the second prestratum by the rotation measurement of the second semiconductor die; and shifting the second prestratum by the XY shift of the second semiconductor die.

11. The method of claim 7, wherein a rotation or XY shift of the build-up interconnect structure is no greater than the rotation measurement of the first semiconductor die, the XY shift of the first semiconductor die, the rotation measurement of the second semiconductor die, and the XY shift of the second semiconductor die.

12. The method of claim 7, further comprising controlling a spacing between the unit specific routing to provide spacing greater than or equal to a distance of 10 micrometers between the first prestratum and the second prestratum.

13. The method of claim 7, further comprising forming the first prestratum, the second prestratum, and the unit specific routing connecting the first prestratum and the second prestratum within a single planar conductive layer.

14. A method of making a semiconductor device, comprising:

forming an embedded die panel;

measuring an actual position of a first semiconductor die and an actual position of a second semiconductor die within the embedded die panel to obtain a rotation measurement and XY shift for the first semiconductor die and the second semiconductor die;

interconnecting the first semiconductor die and the second semiconductor die within a package outline by forming a build-up interconnect structure over the embedded die panel, the build-up interconnect structure being formed by:

forming a first prestratum, forming a second prestratum, and forming a fixed portion aligned with the package outline and coupled to the first prestratum and the second prestratum.

15. The method of claim 14, further comprising:

forming the first prestratum aligned with the first semiconductor die; and forming the second prestratum aligned with the second semiconductor die.

16. The method of claim 14, further comprising forming a fixed portion aligned with outline of embedded die panel and coupled to the unit specific routing.

17. The method of claim 14, further comprising controlling a spacing tolerance between the unit specific routing to provide spacing greater than or equal to a distance of 10 micrometers between the first prestratum and the second prestratum.

18. The method of claim 14, further comprising:

rotating the first prestratum by the rotation measurement of the first semiconductor die;

shifting the first prestratum by the XY shift of the first semiconductor die;

rotating the second prestratum by the rotation measurement of the second semiconductor die; and shifting the second prestratum by the XY shift of the second semiconductor die.

19. The method of claim 14, wherein the rotation measurement and the XY shift for one of the first semiconductor die or the second semiconductor die in the embedded die panel comprises a maximum rotation measurement or XY shift that is equal to a maximum semiconductor device rotation measurement or XY shift.

20. The method of claim 14, further comprising forming the first prestratum, the second prestratum, and the unit specific routing connecting the first prestratum and the second prestratum while being formed as a single planar conductive layer.

* * * * *